United States Patent [19]
Ho

[11] Patent Number: 5,742,003
[45] Date of Patent: Apr. 21, 1998

[54] COMPUTER TERMINAL BOX WITH IMPROVED GROUNDING STRUCTURE

[76] Inventor: Hsin Chien Ho, 20F-1, 268, Sec. 1, Wen-Hua Road, Pan Cjiao City, Taipei, Taiwan

[21] Appl. No.: 695,893

[22] Filed: Aug. 12, 1996

[51] Int. Cl.[6] .................................................. H05K 9/00
[52] U.S. Cl. ........................ 174/35 R; 361/686; 361/825; 174/52.1
[58] Field of Search .................................. 361/686, 683, 361/799, 800, 752, 753, 816, 818, 807, 809, 825; 439/76.1; 174/35 R, 52.1

[56] References Cited

U.S. PATENT DOCUMENTS

| | | | |
|---|---|---|---|
| 5,168,428 | 12/1992 | Suzuki | 361/395 |
| 5,354,951 | 10/1994 | Lange, Sr. et al. | 174/35 R |
| 5,383,096 | 1/1995 | Benson et al. | 361/816 |
| 5,590,023 | 12/1996 | Hernandez et al. | 361/683 |

Primary Examiner—Kristine L. Kincaid
Assistant Examiner—Hung V. Ngo
Attorney, Agent, or Firm—Pro-Techtor International

[57] ABSTRACT

A structure for improving the ground connection between the computer and access terminal connectors includes a terminal box for positioning various terminal connectors (such as the screen, mouse, printer, etc.) and mounting onto the computer housing an electrically conductive plate. The terminal box is configured to have a projecting portion having positioning pieces at an upper end and hook pieces at a lower end so as to match the conductive plate that has a bent portion and corresponding upper positioning holes and lower notches with bosses. The conductive plate may be easily fitted onto or removed from the terminal box, requiring no screws or rivets. Circular terminal through holes are provided on the conductive plate and are each provided with side elastic guide pieces for ensuring good ground connection when the terminal connectors in the computer are positioned near the terminal box.

1 Claim, 2 Drawing Sheets

COMPUTER TERMINAL BOX WITH IMPROVED GROUNDING STRUCTURE

BACKGROUND OF THE INVENTION (a) Field of the Invention

The present invention relates to a computer terminal box with improved ground connection.

(b) Description of the Prior Art

Computers are electrical appliances. How to prevent E.M.I. and poor ground connection or electrical conductivity is an important subject of research. Generally, the computer has a metal housing as its framework. Manufacturers usually provide a metal sheet near the housing to prevent E.M.I.; the effects are averagely good. Efforts have also been put to achieve good ground connection among electronic components and paths. However, the coupling or connection between the computer mainframe and the outside has often been neglected. The connection between the computer mainframe and the outside is generally achieved by a terminal box mounted at a rear wall of the computer housing. Electronic signals of the computer are connected via buses to each terminal connector and the terminal connectors are secured on the terminal box. Externally connected apparatus such as the monitor, mouse, printer, etc., may be connected to the mainframe by insertion of their terminals into the terminal connectors inside the terminal box. A method of achieving the connection is to use screws or rivets to fix the terminal connectors on the terminal box. Another method is to fix the terminal connectors on other parts with the terminal connectors aligning with preformed terminal insert holes on the terminal box; an example is the connection of the terminal connector of the computer keyboard to the computer. As the terminal connector is not in contact with the terminal box (just adjacent thereto), there is no ground connection.

It is necessary that there is suitable ground connection for the buses and the terminal connectors when they are fixed on the terminal box.

SUMMARY OF THE INVENTION

Accordingly, a primary object of the present invention is to eliminate the drawbacks in the prior art.

In order to achieve the above-mentioned object, the present invention essentially comprises a terminal box for positioning various terminal connectors (male or female) and for mounting at a rear wall of a computer housing, the terminal box being configured to have a projecting portion provided with a plurality of positioning pieces at an upper end of a front planar side thereof and a plurality of upwardly facing hook pieces near a lower end thereof, a conductive plate being fitted onto the front planar side of the terminal box, the conductive plate having a bent portion at an upper end, a plurality of positioning holes at the bend between the bent portion and a front planar side thereof for engaging the positioning pieces, and a plurality of notches with bosses at a lower end for engaging the hook pieces, the conductive plate further having terminal insert holes with side elastic guide pieces extending therefrom to allow good ground connection when some terminal connectors are positioned on or near the terminal box.

BRIEF DESCRIPTION OF THE DRAWINGS

The foregoing and other features and advantages of the present invention will be more clearly understood from the following detailed description and the accompanying drawings, in which.

DETAILED DESCRIPTION OF THE PREFERRED EMBODIMENT

Figure 1:
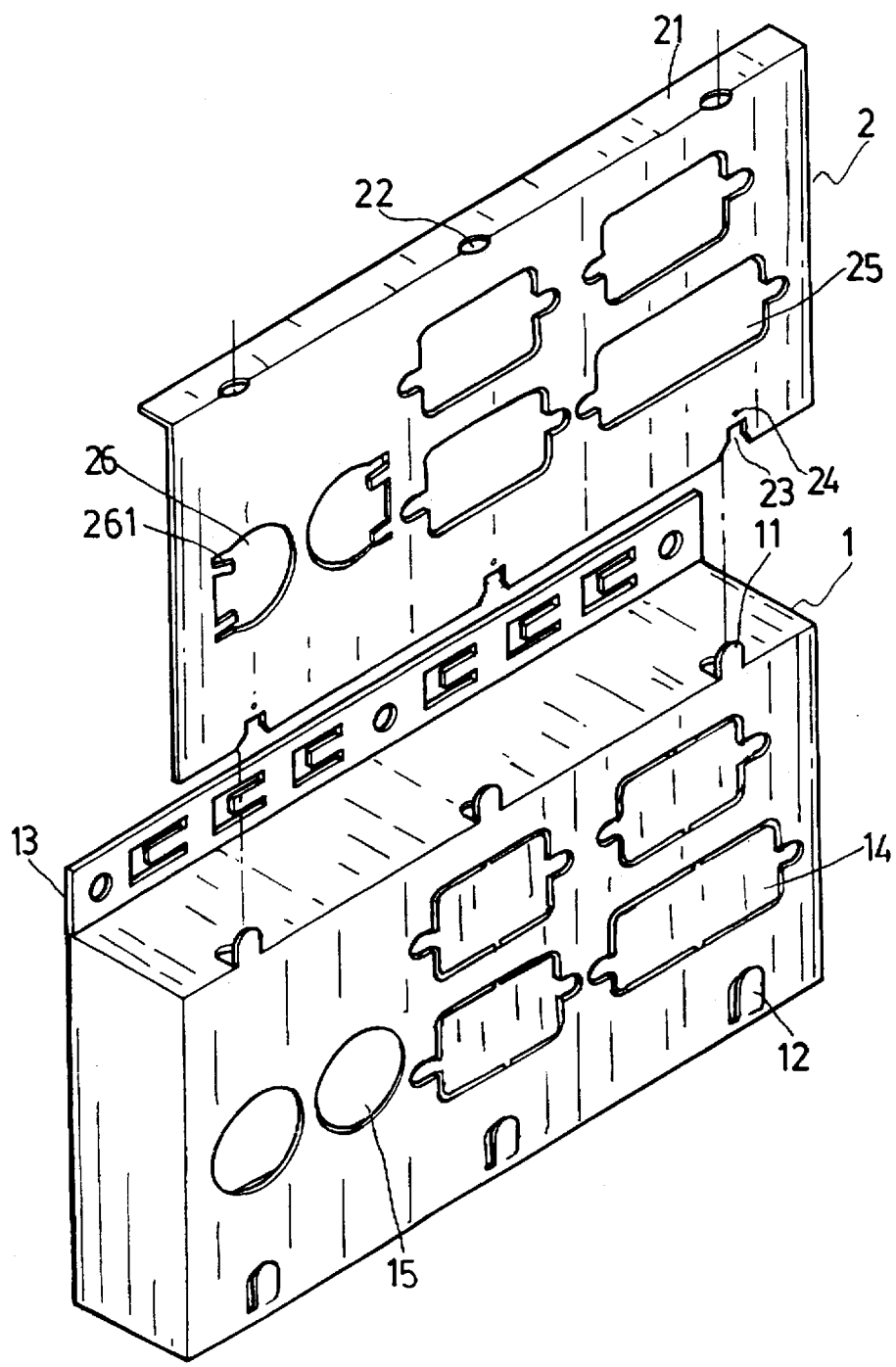
FIG. 1 is an exploded elevational view of the present invention.
Figure 2:
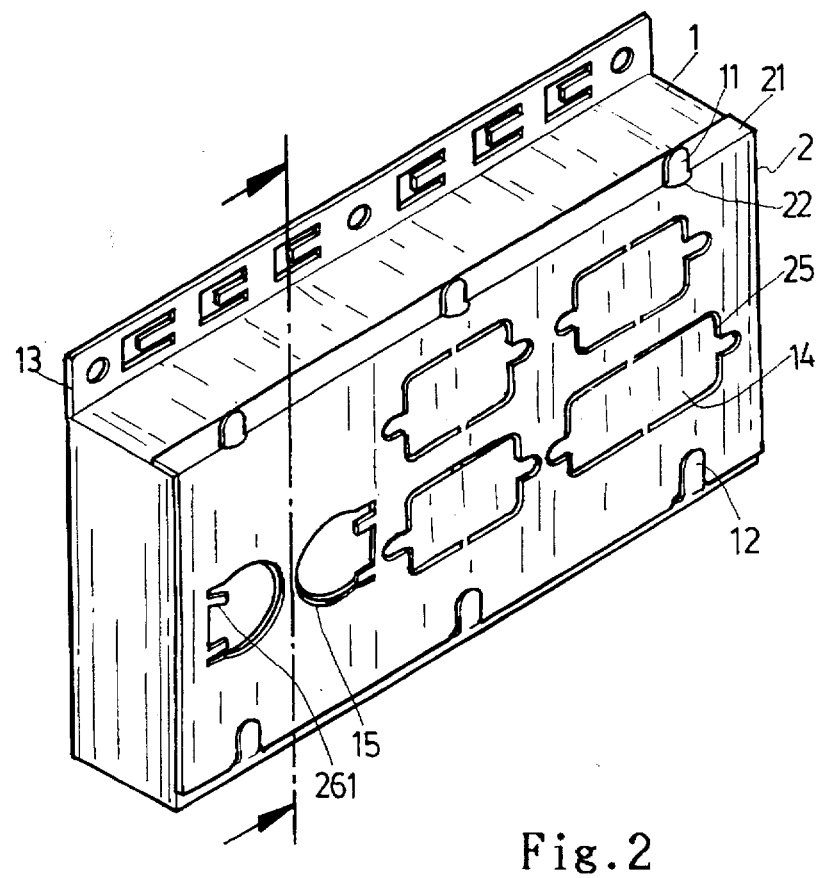
FIG. 2 is an elevational view showing connection of a terminal box and a conductive plate according to the present invention.
Figure 3:
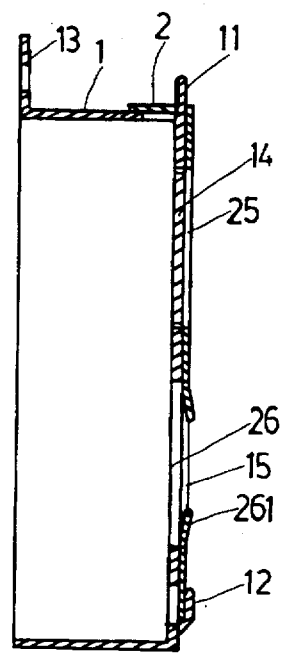
FIG. 3 is a schematic sectional view of FIG. 1.

As shown in the drawings, the present invention essentially comprises a terminal case 1 that may be fixed at a rear wall of a computer housing and an electrically conductive plate 2. An upper side of a front planar surface of a projecting portion of the terminal box 1 is provided with a plurality of positioning pieces 11. A plurality of upwardly facing hook pieces 12 are also provided on the same side of the terminal box 1 near a lower portion thereof. An upper end of the terminal box 1 is provided with an extension plate 13 for mounting to the computer housing. The planar side of the projecting portion is also provided with detachable and rectangular terminal through hole cover plates 14 and circular terminal through hole cover plates 15. The conductive plate 2 has a bent portion 21 at an upper end thereof. At the bend between a front planar surface of the plate 2 and the bent portion 21 are provided a plurality of positioning holes 22 for matching the positioning pieces 11. Corresponding notches 23 are also provided at the lower end. The notches 23 each have a boss 24 disposed thereabove. The conductive plate 2 is also provided with rectangular terminal through holes 25 and circular terminal through holes 26 at corresponding positions.

As shown in FIG. 1, the conductive plate 2 may be fitted onto the front planar side of the terminal box 1 from above such that the notches 23 at the lower end of the conductive plate 2 may be engaged by the hook pieces 12 with their respective bosses urging against the respective inner rims of the hook pieces 12 to generate good electrically conductive effects. The positioning holes 22 are also fitted onto the positioning pieces 11 for positioning the conductive plate 2. This arrangement enables firm connection and easy mounting or dismantling. Elastic guide pieces 261 are configured to extend from one side of the circular terminal through holes 26 so as to achieve good ground connection when the terminal connectors of the computer are positioned near the terminal box 1. The present invention provides an ingenious and simple device to improve the ground connection of terminals in the computer.

Although the present invention has been illustrated and described with reference to the preferred embodiment thereof, it should be understood that it is in no way limited to the details of such embodiment but is capable of numerous modifications within the scope of the appended claims.

We claim:

1. A grounding structure for computer terminal boxes comprising:

a terminal box adapted to be fixed to a wall of a computer housing and an electrically conductive plate; wherein said terminal box includes an inner wall with a plurality of positioning pieces extending upward from an upper side thereof, said inner wall further includes a plurality of hook pieces near a lower side thereof, said inner wall includes an extension plate adapted to facilitate securing said terminal box to the computer housing, and said inner wall includes a plurality of detachable rectangular through hole cover plates and a plurality of detachable circular through hole cover plates, said electrically conductive plate includes an angled portion at an upper end thereof, a plurality of positioning holes are provided at a junction of a main body of said electrically conductive plate and said angled portion, said positioning holes correspond in location to said positioning pieces of said terminal box, said electrically conductive plate further includes a plurality of notches at a lower end thereof, said notches correspond in location to said hook pieces of said terminal box, a projecting boss is positioned above each of said notches, said electrically conductive plate further includes a plurality of rectangular terminal through holes and a plurality of circular through holes, said circular through holes include elastic guide pieces extending from sides thereof, said rectangular through holes and said circular through holes correspond in position to said rectangular cover plates and said circular cover plates of said terminal box; such that said electrically conductive plate is fitted onto said inner wall of said terminal box, said positioning holes being received on said positioning pieces, and said notches engaging said hook pieces so that said bosses urge said electrically conductive plate toward said inner wall of said terminal box.

\* \* \* \* \*